May 31, 1966 S. KAYE 3,254,278

TUNNEL DIODE DEVICE

Filed Nov. 14, 1960

INVENTOR.
STEPHEN KAYE

BY [signature]

ATTORNEY

United States Patent Office 3,254,278
Patented May 31, 1966

3,254,278
TUNNEL DIODE DEVICE

Stephen Kaye, Pasadena, Calif., assignor to Hoffman Electronics Corporation, a corporation of California
Filed Nov. 14, 1960, Ser. No. 69,193
6 Claims. (Cl. 317—235)

The present invention relates to semiconductor devices, and more particularly to semiconductor tunnel diode devices.

It has been found that in semiconductors, by the establishment of appropriate impurity distributions therein, regions can be established in which the concentrations of holes and electrons are so extremely small as to be negligible in comparison with the concentrations of holes and electrons elsewhere in the material. Such regions are called space charge regions. The fields for space charge regions are very high even for small or zero biases. Hence, any carriers injected into a space charge region will traverse it quickly, resulting in a very short transit time. The width of the space charge region is proportional to $N^{-1/3}$, where N is the charge density on the higher resistivity side of the semiconductor junction, for an abrupt transition from p-type to n-type.

A tunnel diode is a semiconductor diode that derives its name from the tunneling of electrons through its junction. A tunnel diode exhibits a negative conductance phenomenon that arises from the fact that the tunnel current decreases with increasing voltage in a fairly low forward-bias region. The tunneling is effected by majority carriers and occurs in a fraction of a milli-microsecond, making the tunnel diode available for use as an extremely fast switch or as an active microwave element. Because of the very rapid action, low power consumption, and high efficiency of tunnel diodes, they can be used for an almost limitless number of applications.

Tunnel diodes are more than 1,000 times more conductive than conventional diodes. This higher conductivity is the result of the fact that tunnel diodes are heavily doped p-n devices. That is, tunnel diodes have a very high concentration of donor and acceptor impurities. Tunnel diodes have $10^{19}$ or more carriers per cubic centimeters, and are not even affected by relatively intense ionizing radiation or severe surface contamination. Becaus of the high conductivity, the width of the space charge region, or depletion layer, of the tunnel diode is very narrow. A tunnel diode has an abrupt transition of only 150 angstrom units or less between the donor and acceptor regions. Such an extremely narrow junction or space charge region results from special alloying techniques and strongly degenerate electron and hole distributions. Electrons can tunnel through the extremely narrow junction even though they lack the energy to surmount the potential barrier of the junction. Electrons tunneling through the narrow transition region produce a negative conductance region in the forward biased portion of the characteristic curve.

The probability of tunneling decreases rapidly with an increase in the width of the space charge region. Tunneling becomes of no practical importance when the space charge region is over 150 angstrom units wide. The width of the space charge region of present tunnel diodes generally varies from 50 to 80 angstrom units.

No tunneling current flows when zero external bias is applied to a tunnel diode. When a bias in the forward direction is applied, any electrons in the conduction band on the n-type side with an energy within the range of the unfilled levels of the valence band on the p-type side can cross the forbidden region. Current will increase with an increase in forward bias, until the top of the filled portion of the conduction band on the n-type side reaches the top of the valence band on the p-type side. A further increase in forward bias leads to a decrease in current, since some of the electrons near the top of the conduction band on the n-type side will be opposite the forbidden gap on the p-type side and cannot tunnel. That is, the energy of the free electrons in the n-type region becomes greater than that of the valence electrons in the p-type region. It is then that the negative conductance region begins on the characteristic curve of the tunnel diode.

Tunneling current ceases when the bottom of the conduction band on the n-type side is opposite the top of the valence band on the p-type side. Any current that thereafter flows will be the result of the injection of conventional minority carriers. That is, as the forward bias is increased, the free holes and electrons acquire enough energy to flow over the potential barrier of the junction, just as in a conventional diode.

A small reverse bias applied to a tunnel diode causes the valence electrons of the semiconductor atoms near the junction to tunnel across the junction into the n-type region. The number of electrons so tunneling increases as the reverse bias is increased. In effect, a reverse-biased tunnel diode has a zero reverse breakdown voltage.

Thus, under reverse and low foward biases, the tunnel diode has a low A.C. resistance. Under intermediate forward biases the tunnel diode has a negative-conductance characteristic, and under higher forward biases its characteristic approaches that of a conventional diode.

The magnitude of the tunnel current is highly dependent upon the width of the space charge region at the p-n junction. A means for altering at will the width of the space charge region at the p-n junction of a tunnel diode would make it possible to control the amplification and sensitivity characteristics and is very desirable.

It is an object of the present invention, therefore, to provide a novel semiconductor tunnel diode.

It is another object of the present invention to provide a tunnel diode in which it is possible to alter the magnitude of the tunnel current.

According to the present invention, an additional contact for the injection of minority carriers is added to a conventional tunnel diode device in order to be able to alter the width of the space charge region at the p-n junction, and, hence, the magnitude of the tunnel current.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
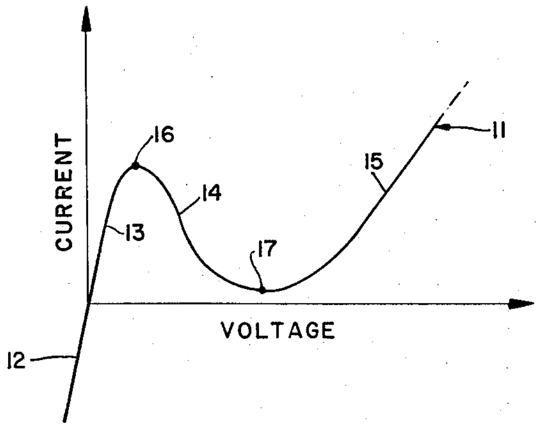
FIGURE 1 is a graph of the characteristic of a typical tunnel diode.

Referring now to the drawings, FIGURE 1 shows typical tunnel-diode characteristic curve 11 having reverse bias portion 12, low forward bias portion 13, intermediate forward bias portion 14, and high forward bias portion 15.

Portions 12 and 13 show that under reverse and low forward biases, the tunnel diode has a low A.C. resistance. Portion 14 shows that under an intermediate forward bias, the tunnel diode has a negative conductance characteristic. Portion 15 shows that under a high forward bias, the tunnel diode characteristic approaches that of a conventional semiconductor diode. Peak point 16 is the point at which negative conductance first occurs, and valley point 17 is the point at which negative conductance ceases.

Figure 2:
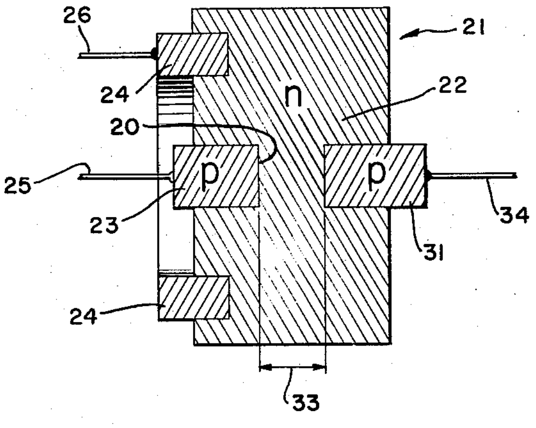
FIGURE 2 is a sectional view of a tunnel diode device according to the preferred embodiment of the present invention.

FIGURE 2 shows tunnel diode 21 having n-type body region 22 and p-type region 23. Body region 22 is preferably a silicon semiconductor wafer that is highly doped with arsenic. P-type region 23 can be formed by alloying an aluminum-boron tunnel contact to body region 22. Ring-like ohmic base contact 24 is preferably a gold-antimony alloy that is alloyed to body region 22. Leads 25 and 26 are soldered to p-type region 23 and contact 24, respectively. Control contact 31 is a p-type aluminum-boron alloy that is alloyed to body region 22. Control contact 31 should preferably be located within a minority carrier diffusion length of p-n junction 32. Thus, the distance 33 between p-type region 23 and control contact 31 is less than a minority carrier diffusion length. Lead 34 is soldered to control contact 31. Similar considerations would apply to a device having a p-type body region.

By the application to control contact 31 of a suitable potential, such as 1 volt, minority carriers can be injected into body region 22. The potential should be sufficiently positive with respect to body region 22 and base contact 24 so as to bias diode 21 into high bias portion 15 of FIGURE 1. The injected minority carriers will diffuse to the vicinity of p-n junction 32 and will alter the charge density in that region. The change in charge density alters the width of the space charge region at p-n junction 32, resulting in a large alteration in the magnitude of the tunnel current. Thus, contact 31 serves as a means for altering at will the width of the space charge region at p-n junction 32, making it possible to control the amplification and sensitivity characteristics of tunnel diode 11. The potential difference between control contact 31 and base contact 24 will control the current between p-type region 23 and base contact 24, so long as the device is biased into either low forward bias portion 13 or intermediate forward bias portion 14 of FIGURE 1. For the example given, the potential difference between p-type region 23 and base contact 24 will be about 0.5 volt.

As an alternative to the embodiment shown in FIGURE 1, since body region 22 must of necessity be heavily doped, one way of producing the injecting control contact would be to form upon body region 22 a semiconductor material having an energy gap greater than that of the material of body region 22. When body region 22 is made of silicon, zinc sulfide could be evaporated upon the silicon. When the control contact has a wider band gap than body region 22, the contact potential for electrons flowing from body region 22 into the control contact will be higher than the contact potential for holes entering body region 22 from the control contact. The difference in contact potential is approximately the difference in band-gap. The contact potential enters exponentially into the current-flow equations.

Figure 3:
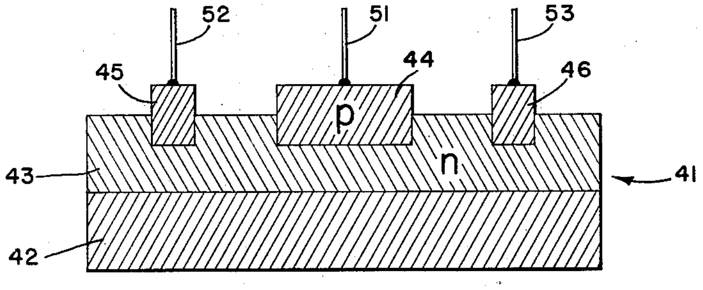
FIGURE 3 is a sectional view of a different embodiment of the present invention.

FIGURE 3 shows a different embodiment in which it is not necessary that the control contact be located within a minority carrier diffusion length of the tunnel contact. In fact, the distance need only be as small as is convenient. N-type silicon wafer 41 is divided into high resistivity region 42 and low resistivity region 43, which contains p-type tunnel contact 44. Region 43 also contains ohmic base contact 45 and ohmic control contact 46, one on each side of tunnel contact 44. Leads 51, 52 and 53 are soldered to contacts 44, 45 and 46, respectively.

Region 42 should have a resistivity greater than .01 ohm centimeters. Low resistivity region 43 can be formed by diffusing arsenic into wafer 41 and should be sufficiently deep to prevent tunnel contact 44 from physically extending into high resistivity region 42. Tunnel contact 44 can be formed by alloying an aluminum-boron alloy to region 43, which should have a resistivity less than .001 ohm centimeters to allow tunneling to occur. Base contact 45 and control contact 46 are ohmic contacts, each of which can be formed by alloying a gold-antimony alloy to region 43. Thus, the tunnel diode device shown in FIGURE 3 has two ohmic contacts and one rectifying contact, instead of the two rectifying contacts and one ohmic contact used with transistors.

By passing a suitable current between base contact 45 and control contact 46, the tunneling characteristic of the current between base contact 45 and tunnel contact 44 can be altered. The current required between base contact 45 and control contact 46 depends upon the dimensions of the device, but should be such as will cause a voltage drop in region 43 of about 50 millivolts along the length of tunnel contact 44.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A tunnel diode device comprising: a tunnel diode having first- and second-type conductivity regions separated by a p-n junction; first and second leads coupled to said first and second-type regions, respectively; and a contact connected to said first-type region for injecting minority carriers into said first-type region to alter the width of the space charge region at said p-n junction when a suitable potential is applied to said contact, thereby altering the magnitude of the tunnel current, said contact being located within a minority carrier diffusion length of said p-n junction.

2. Apparatus as defined in claim 1 in which said contact is a wide energy band-gap emitter.

3. A tunnel diode device comprising: a tunnel diode having first-type and second-type conductivity regions separated by a p-n junction; and a rectifying contact made to said first-type region, said contact being located within a minority carrier diffusion length of said p-n junction and capable of injecting minority carriers into said first-type region when a suitable potential is applied to said contact, thereby altering the width of the space charge region at said p-n junction and the magnitude of the tunnel current.

4. A tunnel diode device comprising: a tunnel diode having first-type and second-type conductivity regions separated by a p-n junction; and an ohmic contact made to said first-type region; said contact being capable of injecting minority carriers into said first-type region when a suitable potential is applied to said contact, thereby altering the width of the space charge region at said p-n junction and the magnitude of the tunnel current, and said first-type region comprising a low-resistivity region to which said contact and said p-n junction are restricted.

5. Apparatus as defined in claim 3, in which said contact is a wide energy band-gap emitter.

6. A tunnel diode device comprising: a tunnel diode having first-type and second-type conductivity regions separated by a first p-n junction; first and second leads coupled to said first-type and second-type regions, respectively; and a contact connected to said first-type region for injecting minority carriers into said first-type region to alter the width of the space charge region at said p-n junction when a suitable potential is applied to said contact, thereby altering the magnitude of the tunnel current, said contact being separated from said first-type region by a second p-n junction.

References Cited by the Examiner

UNITED STATES PATENTS

| | | | |
|---|---|---|---|
| 2,842,668 | 7/1958 | Rutz | 317—235 |
| 2,962,605 | 11/1960 | Grosvalet | 317—235 |
| 3,033,714 | 5/1962 | Ezaki et al. | 317—235 |
| 3,035,213 | 5/1962 | Schmidt | 307—88.5 |
| 3,119,026 | 1/1964 | Dorendorf et al. | 317—234 |

OTHER REFERENCES

"The International Dictionary of Physics and Electronics" by D. Van Norstrand, copyright 1961 (p. 338).

JOHN W. HUCKERT, *Primary Examiner.*

SAMUEL BERNSTEIN, GEORGE WESTBY, DAVID GALVIN, *Examiners.*

A. B. GOODALL, L. ZALMAN, *Assistant Examiners.*